United States Patent
Miyashita

(10) Patent No.: US 8,856,625 B2
(45) Date of Patent: Oct. 7, 2014

(54) TRANSMISSION SYSTEM, DECODING DEVICE, MEMORY CONTROLLER, AND MEMORY SYSTEM

(75) Inventor: Daisuke Miyashita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 13/601,186

(22) Filed: Aug. 31, 2012

(65) Prior Publication Data

US 2013/0254632 A1   Sep. 26, 2013

(30) Foreign Application Priority Data

Mar. 22, 2012   (JP) ................................ 2012-065400

(51) Int. Cl.
*H03M 13/00* (2006.01)

(52) U.S. Cl.
USPC ........................................................ 714/776

(58) Field of Classification Search
CPC .... G06F 11/10; G06F 12/16; H03M 13/6577; H03M 13/1117; H03M 13/6502; H03M 13/1137; H03M 13/1185; H03M 13/616; H03M 13/1105; H03M 13/1111; H03M 13/613; H03M 13/6566; H04L 1/0057; H04L 1/0052; H04L 1/0054; H04L 1/0061
See application file for complete search history.

(56) References Cited

U.S. PATENT DOCUMENTS

| 2010/0103015 A1 | 4/2010 | Yoshida et al. |
| 2011/0239080 A1 | 9/2011 | Sakaue et al. |

FOREIGN PATENT DOCUMENTS

| JP | 2009-038662 | 2/2009 |
| JP | 2009-159037 | 7/2009 |

*Primary Examiner* — Guerrier Merant
(74) *Attorney, Agent, or Firm* — Patterson & Sheridan, LLP

(57) ABSTRACT

A decoding device is provided for decoding received data which is coded based on low-density parity-check code. The decoding device includes a variable node operation unit, a check node operation unit, and a circuit in the transmission path between the two units. The variable node operation unit generates secondary probability information based on primary probability information and the coded data. The check node operation unit generates the primary probability information based on the secondary probability information. The circuit transmits the primary probability information and the secondary probability information between the variable node operation unit and the check node operation unit. In addition, at least one of the primary probability information and the secondary probability information transmitted via the transmission path is represented by a time signal.

20 Claims, 20 Drawing Sheets

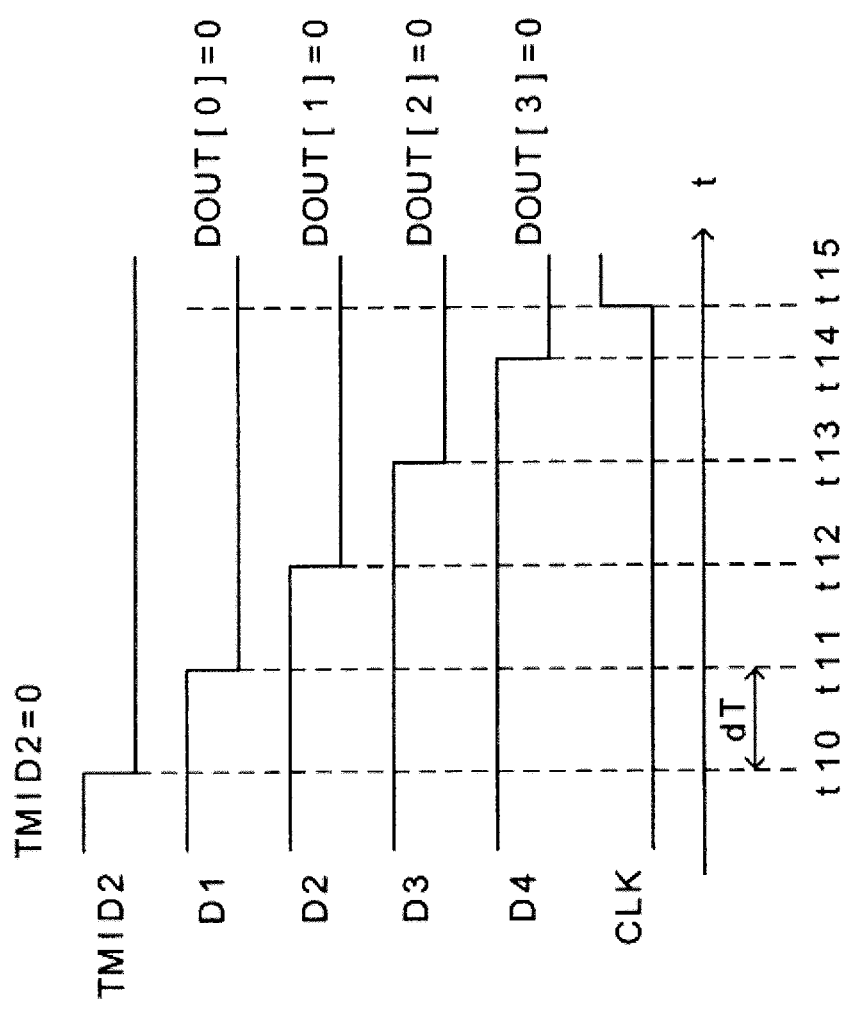

100c

DIN1=3, DIN2=1

DIN=3, m=0.7, DOUT=2

DIN=2, DOUT=-2

US 8,856,625 B2

TRANSMISSION SYSTEM, DECODING DEVICE, MEMORY CONTROLLER, AND MEMORY SYSTEM

CROSS-REFERENCE TO RELATED APPLICATION

This application is based upon and claims the benefit of priority from Japanese Patent Application No. 2012-065400, filed Mar. 22, 2012; the entire contents of which are incorporated herein by reference.

FIELD

Embodiments described herein relate to a transmission system, decoding device, memory controller, and memory system.

BACKGROUND

In recent years, the amount of information processed by information processing devices has dramatically increased, and as a result, the number of digital signals for representing the information and the number of bits are on the rise. For that reason, numerous signal lines have become necessary in order to transmit digital signals between information processing devices or between modules within the information processing devices.

DESCRIPTION OF THE DRAWINGS

FIGS. 6A and 6B are voltage waveform diagrams showing the operation of the TDC of FIG. 5.

DETAILED DESCRIPTION

In general, embodiments will be described below with reference to the drawings. According to the embodiments, there is provided a transmission system, decoding device, memory controller, and memory system that can transmit a signal over few signal lines.

A decoding device according to an embodiment is provided for decoding coded data based on low-density parity-check code. The decoding device is provided with a variable node operation unit, a check node operation unit, a transmission path circuit, and a decoding unit. The variable node operation unit generates secondary probability information based on primary probability information and the received data. The check node operation unit generates the primary probability information based on the secondary probability information. The transmission path circuit transmits primary probability information and secondary probability information between the variable node operation unit and the check node operation unit. The decoding unit decodes the received data based on the secondary probability information. In addition, at least one of the primary probability information and the secondary probability information transmitted via the transmission path circuit is represented by a time signal.

Embodiment 1

Figure 1:
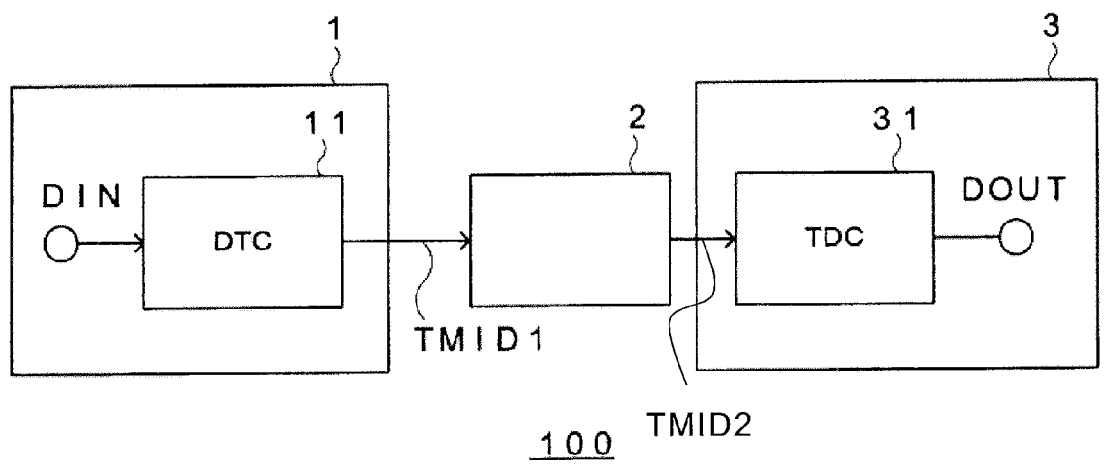
FIG. 1 is a schematic block diagram of a transmission system according to a first embodiment.

FIG. 1 is a schematic block diagram of transmission system 100 in accordance with the first embodiment. Transmission system 100 is provided with transmitting portion 1, circuit 2, and receiving portion 3. This transmission system transmits a time signal converted from a digital signal DIN from transmitting portion 1 to receiving portion 3 and obtains a digital signal DOUT that is equivalent to or related to digital signal DIN.

Transmitting portion 1 includes digital-to-time converter (hereafter called "DTC") 11 for performing an operation to convert digital signal DIN to time signal TMID1 to be described hereinafter and transmits time signal TMID1 to circuit 2. Circuit 2 transmits time signal TMID2 based on time signal TMID1 to receiving portion 3. Receiving portion 3 receives time signal TMID2 and in addition includes time-to-digital converter (hereafter called "TDC") 31 for performing an operation to convert it to digital signal DOUT.

Transmitting portion 1, circuit 2, and receiving portion 3 may be configured in one integrated circuit. Alternatively, transmitting portion 1 and receiving portion 3, for example, may each be configured in two operational devices such as a personal computer, and circuit 2 may be configured to transmit a signal between the operational devices.

The digital signals DIN, DOUT in the present embodiment are not binary codes; instead, they are thermometer codes (also known as unary codes), where values are represented by the number of 1's (high) followed by 0's, or alternatively, the number of 0's (low) followed by a 1's. If the digital signal to be transmitted is represented by a binary code, a circuit for converting the binary code to thermometer code may be provided in transmitting portion 1. Additionally, if the received digital signal DOUT is to be used as a binary code, a circuit for converting the thermometer code to binary code may be provided in receiving portion 3.

In order to simplify the following description, an example will be shown in which digital signal DIN is composed of 4 signal lines (4 bits) that is capable of representing 5 values from 0-4. More specifically, if the signal lines that constitute digital signal DIN are "0000", the value of digital signal DIN is 0; if they are "0001", the value is 1; if they are "0011", the value is 2; if they are "0111", the value is 3; and if they are "1111", the value is 4.

Additionally, the time signal in the present embodiment is a signal representing how many seconds after a certain reference time the voltage of the signal line transitions. More generally, the value of the time signal is represented by the time difference between a reference time and the time at which the voltage of the signal line transitions. Consequently, with time signals, plural values can be represented by one signal line. This time signal is generated, for example, by delaying a single reference signal in the manner described below.

Figure 2:
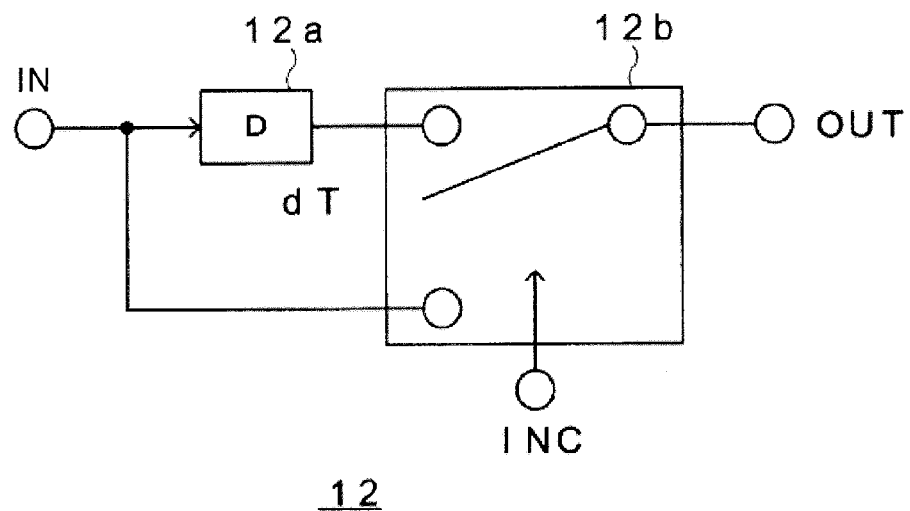
FIG. 2 is a block diagram showing an example of a unit delay circuit to be used in the transmission system of FIG. 1.

FIG. 2 is a block diagram showing an example of unit delay circuit 12 to be used in DTC 11. Unit delay circuit 12 includes both delay element (D) 12a and switch 12b. Unless explicitly stated below, wiring delays and the like, other than the delay element, will be ignored.

Delay element 12a is directly connected to an even number of CMOS inverters, in one example. This delay element 12a generates a delay signal by delaying input signal IN by a unit delay time dT. If delay control signal INC is high, switch 12b outputs the delay signal output from delay element 12a as output signal OUT. Conversely, if delay control signal INC is low, switch 12b outputs input signal IN as output signal OUT.

Figure 3:
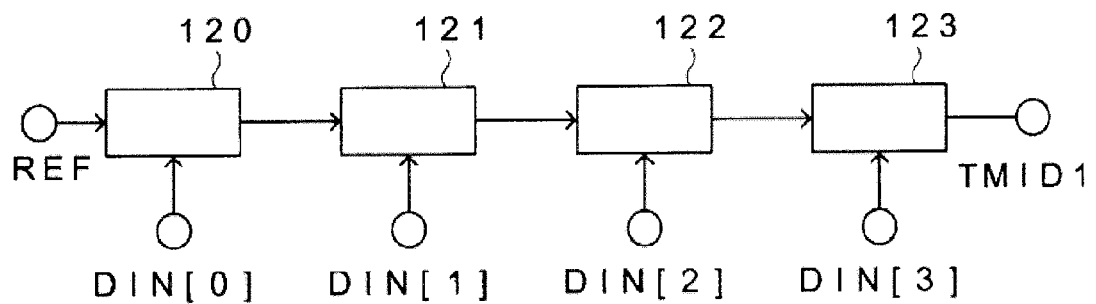
FIG. 3 is a block diagram of a digital-to-time converter (DTC) in which the unit delay circuit of FIG. 2 is implemented.

FIG. 3 is a block diagram of DTC 11 in which unit delay circuit 12 of FIG. 2 is used. DTC 11 includes plural (4 in the example of FIG. 3) cascade-connected unit delay circuits 120-123. Unit delay circuits 120-123 are each the unit delay circuit 12 that is shown in FIG. 2. Reference signal REF, which is composed of one signal line, the voltage of which transitions from high to low at the reference time, is input at the first-stage unit delay circuit 120. And time signal TMID1, which is composed of one signal line, is output at the final-stage unit delay circuit 123. In addition, in each unit delay circuit 12k (k=0-3), the kth bit (the value of the kth signal line) DIN[k] of digital signal DIN is input as a delay control signal.

Figure 4:
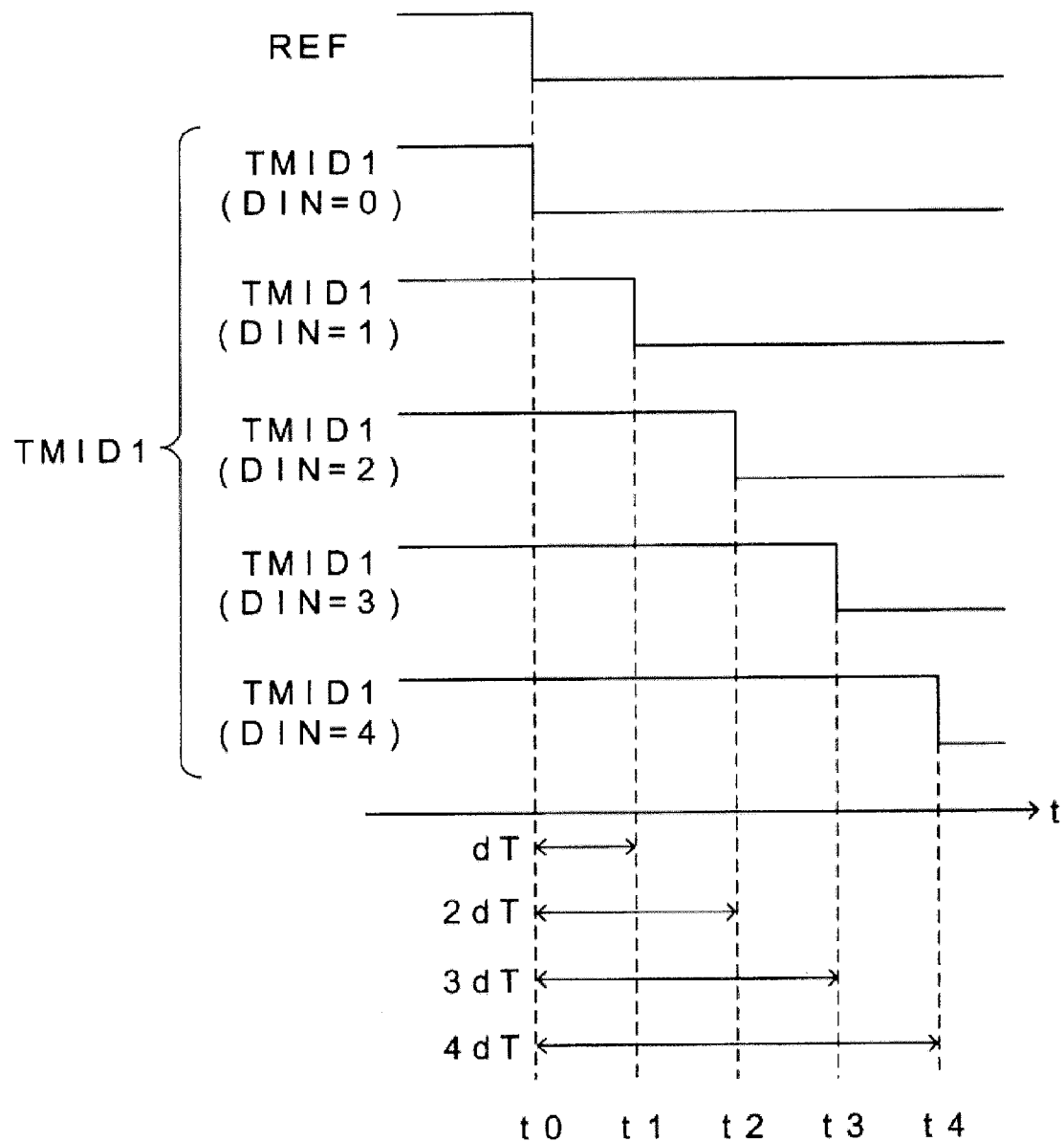
FIG. 4 is a voltage waveform diagram showing the operation of DTC of FIG. 3.

FIG. 4 is a voltage waveform diagram showing the operation of DTC 11 of FIG. 3. The horizontal axis is time, and the vertical axis is the voltage level of reference signal REF and time signal TMID1 (for each case of DIN=0-4). As the diagram shows, reference signal REF transitions from high to low at reference time t0.

When digital signal DIN=0, in other words when it is "0000", none of the unit delay circuits 120-123 in FIG. 3 delay the input signal. Consequently, DTC 11 converts digital signal DIN to time signal TMID 1, which is not delayed relative to reference signal REF.

When digital signal DIN=1, in other words when it is "0001", only one of the unit delay circuits 120-123 in FIG. 3, which is unit delay circuit 123, delays the input signal. Consequently, DTC 11 converts digital signal DIN to time signal TMID1, which is delayed by dT relative to reference signal REF.

When digital signal DIN=2, in other words when it is "0011", only two of the unit delay circuits 120-123 in FIG. 3, which are unit delay circuits 122 and 123, delay the input signal. Consequently, DTC 11 converts digital signal DIN to time signal TMID1, which is delayed by 2dT relative to reference signal REF.

The remaining cases in which digital signal DIN=3, 4 are converted in the same manner; of the plural unit delay circuits, the unit delay circuits with a number "1" in the signal lines that constitute the digital signal DIN delay the input signal. In this way, DTC 11 converts digital signal DIN to time signal TMID1, which is only delayed by a time proportional to the value of digital signal DIN relative to reference signal REF.

Figure 5:
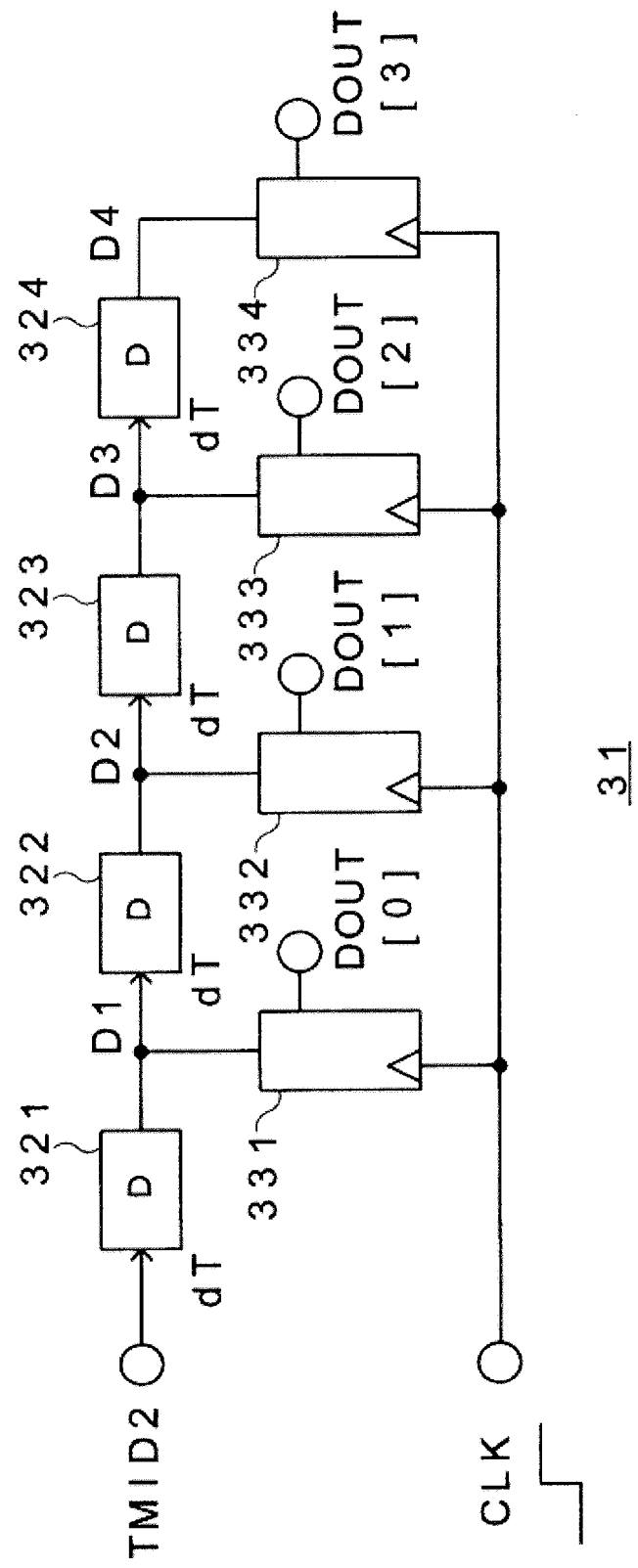
FIG. 5 is a block diagram of a time-to-digital converter (TDC) in the transmission system of FIG. 1.

Next, TDC 31 in receiving portion 3 will be described. FIG. 5 is a block diagram of TDC 31. TDC 31 includes four series-connected delay elements (D) 321-324 and four D flip-flops 331-334. Delay elements 321-324 are each series-connected to an even number of CMOS inverters, in one example.

Delay elements 321-324 generate signals D1-D4, respectively, by delaying the input signal by a unit delay time dT, which is equal to the unit delay time of FIG. 2. Time signal TMID2 is input in first-stage delay element 321.

Clock signal CLK, which transitions from low to high at the reference time, is input into the clock input terminal of each D flip-flop 331-334, and signals D1-D4 are each input into the data input terminals. The value of signal Dk (k=0-3), at the time when clock signal CLK transitions from low to high, is output as signal DOUT[k]. Digital signal DOUT is composed of signals DOUT[0] to DOUT[3].

Figure 6B:
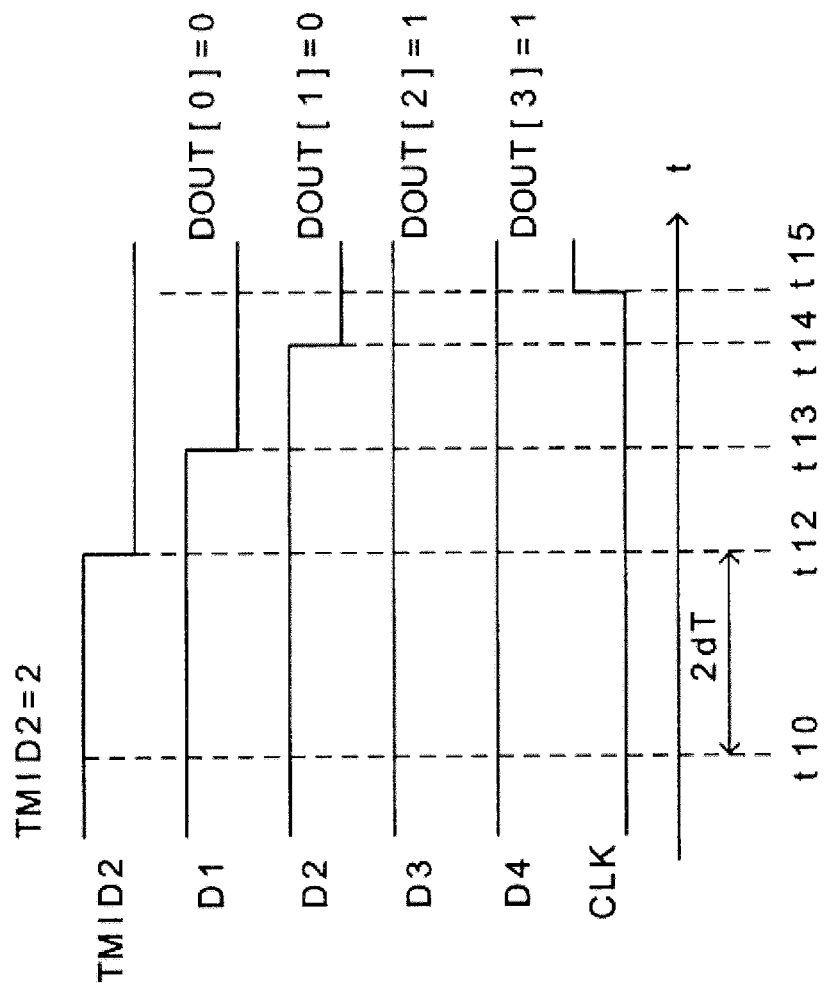

FIGS. 6A and 6B are voltage waveform diagrams showing the operation of TDC 31 of FIG. 5. FIG. 6A shows an example where TMID2=0, and FIG. 6B shows an example where TMID2=2. The horizontal axis is time, and the vertical axis is time signal TMID2, signals D1-D4, and clock signal CLK, in that order.

In FIG. 6A, TMID2=0, and time signal TMID2 transitions from high to low at time t10. Starting from time t10, signals D1-D4 transition from high to low at times t11, t12, t13, and t14 after times dT, 2dT, 3dT, and 4dT, respectively, have passed. Then, at time t15, which is the reference time after time t14, clock signal CLK transitions from low to high. Consequently, signals DOUT[0] through DOUT[3] all become 0. As a result, TDC 31 can convert time signal TMID2 with a value of 0 to digital signal DOUT with a value of 0.

In FIG. 6B, TMID2=0, and time signal TMID2 transitions from high to low at time t12, which is delayed from time t10 by only 2dT. Signals D1, D2 transition from high to low at times t13, t14, respectively, but signals D3, D4 are high, even at time t15. Then, at time t15, clock signal CLK transitions from low to high. Consequently, signals DOUT[0] through DOUT[3] become "0011". As a result, TDC 31 can convert time signal TMID2 with a value of 2 to digital signal DOUT with a value of 2.

In addition, the reference time of DTC 11 (time t0 in FIG. 4) and the reference time of TDC 31 (time t15 in FIGS. 6A and 6B) need to be synchronized; in other words, the interval between time t0 and time t15 needs to be set to a fixed time. For that reason, for example, a reference signal may be transmitted from DTC 11 to TDC 31 separately from time signal TMID1, or a shared reference signal may be used for both DTC 11 and TDC 31. In any case, in the event the reference time seems to be out of sync with the desired value due to the effects of wiring delays or the like, the reference time may be adjusted by an arrangement similar to the DTC circuit. To confirm whether the reference time is out of sync with the fixed relationship, the value of the input digital signal of DTC 11 and the value of the output digital signal of TDC 31 can be compared.

A simple example of circuit 2 is a transmission path that transmits time signal TMID1 unchanged as time signal TMID2 from transmitting portion 1 to receiving portion 3. In this case, the number of signal lines from transmitting portion 1 to receiving portion 3 can be reduced. For example, if digital signal DIN has 8 bits, assuming digital signal DIN is transmitted unchanged, 255 signal lines would be needed for thermometer code, and 8 signal lines would even be needed for binary code. By contrast, in the present embodiment, it can be transmitted as time signal TMID1 via one signal line.

In this way, in the first embodiment, the digital signal is transmitted after conversion to a time signal composed of 1 signal. Hence, the signal lines needed for transmission between transmitting portion 1 and circuit 2 as well as between circuit 2 and receiving portion 3 can be reduced. In addition, passive elements such as resistance and capacitance are unnecessary for the circuits of FIG. 2, FIG. 3, and FIG. 5, and they can be configured via logic circuits that are used in digital circuits. Consequently, DTC 11 and TDC 31 can be configured via small circuits.

Other examples of circuit 2 will be described below in the second through the fifth embodiments.

Embodiment 2

The second embodiment shows an example in which circuit 2 is a switch.

Figure 7:
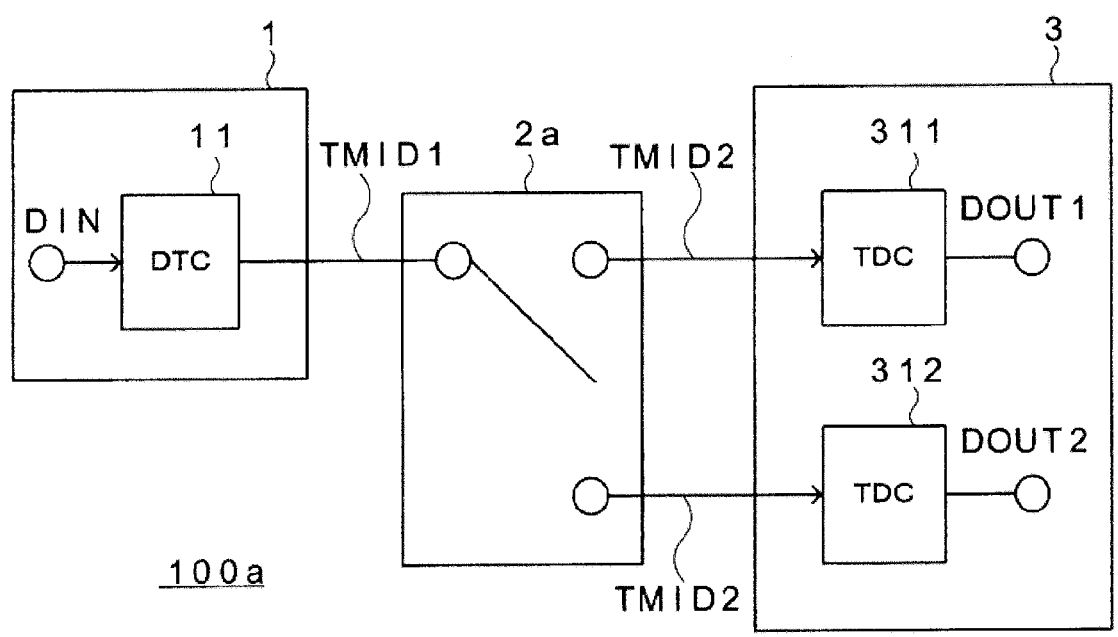
FIG. 7 is a schematic block diagram of a transmission system according to a second embodiment.

FIG. 7 is a schematic block diagram of transmission system 100a in accordance with the second embodiment. In FIG. 7, the same numerals are used to identify components that are the same in FIG. 1, and the description of the points of difference will be the focus below. Receiving portion 3 in transmission system 100a in FIG. 7 includes the two TDCs 311 and 312. In addition, in transmission system 100a, circuit 2 of FIG. 1 is replaced with switch 2a. Switch 2a switches the transmission of time signal TMID1 between TDC 311 and TDC 312, or does not transmit it to either TDC.

Assuming digital signal DIN with 8 bits is input unchanged into switch 2a, 8 signal lines would be needed even for binary code from transmitting portion 1 to switch 2a, and 16 signal lines would be needed from switch 2a to receiving portion 3. By contrast, by converting digital signal DIN using DTC 11 to time signal TMID1 and transmitting it, the signal lines from transmitting portion 1 to switch 2a can be reduced to 1, and the signal lines from switch 2a to receiving portion 3 can be reduced to 2.

FIG. 7 shows an example in which the transmission of the signal is switched from one DTC to any of plural TDCs. However, transmitting portion 1 may include plural DTCs, and receiving portion 3 may include plural TDCs. In such a case, circuit 2a switches the transmission of signals matrix-wise from certain DTCs to certain TDCs.

In addition, transmitting portion 1 may include one DTC, and receiving portion 3 may include one TDC. In such a case, circuit 2a switches in accordance with whether or not a signal is being transmitted from DTC to TDC.

Embodiment 3

The third embodiment shows an example in which circuit 2 is an operational circuit including a logic circuit.

Figure 8:
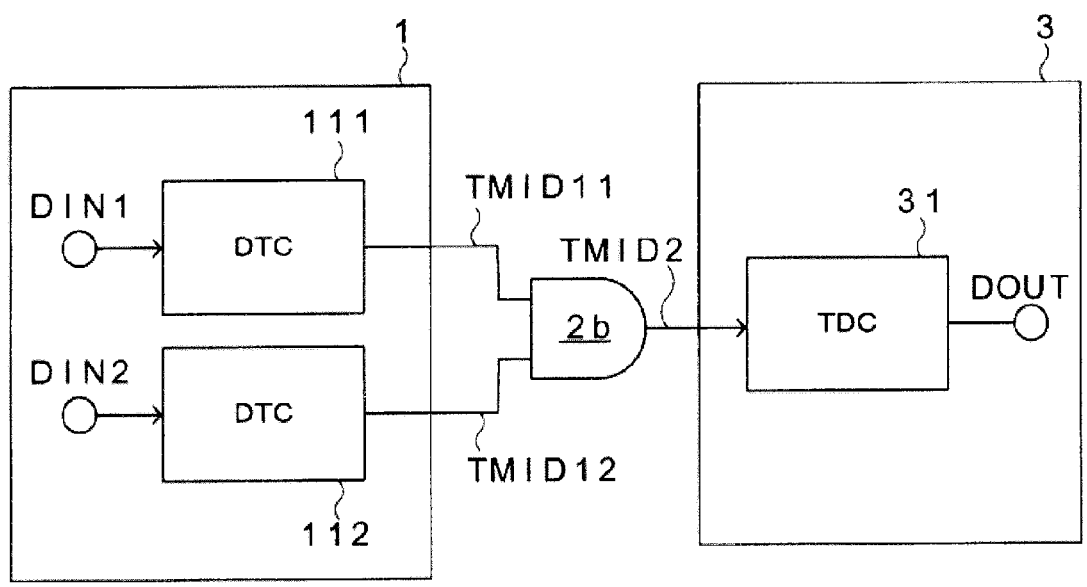
FIG. 8 is a schematic block diagram of a transmission system according to a third embodiment.

FIG. 8 is a schematic block diagram of transmission system 100b in accordance with the third embodiment. In FIG. 8, the same numerals are used to identify components that are the same in FIG. 1, and the description of the points of difference will be the focus below. Transmitting portion 1 in transmission system 100b in FIG. 8 includes the two DTCs 111 and 112. DTCs 111 and 112 convert digital signals DIN1 and DIN2 to time signals TMID11 and TMID12, respectively. In addition, in transmission system 100a of FIG. 8, circuit 2 of FIG. 1 is replaced with AND circuit 2b. AND circuit 2b transmits the logical product of time signals TMID11 and TMID12 to receiving portion 3 as time signal TMID2. As will be described later, time signal TMID2 is the minimum value of time signals TMID11 and TMID12.

Figure 9:
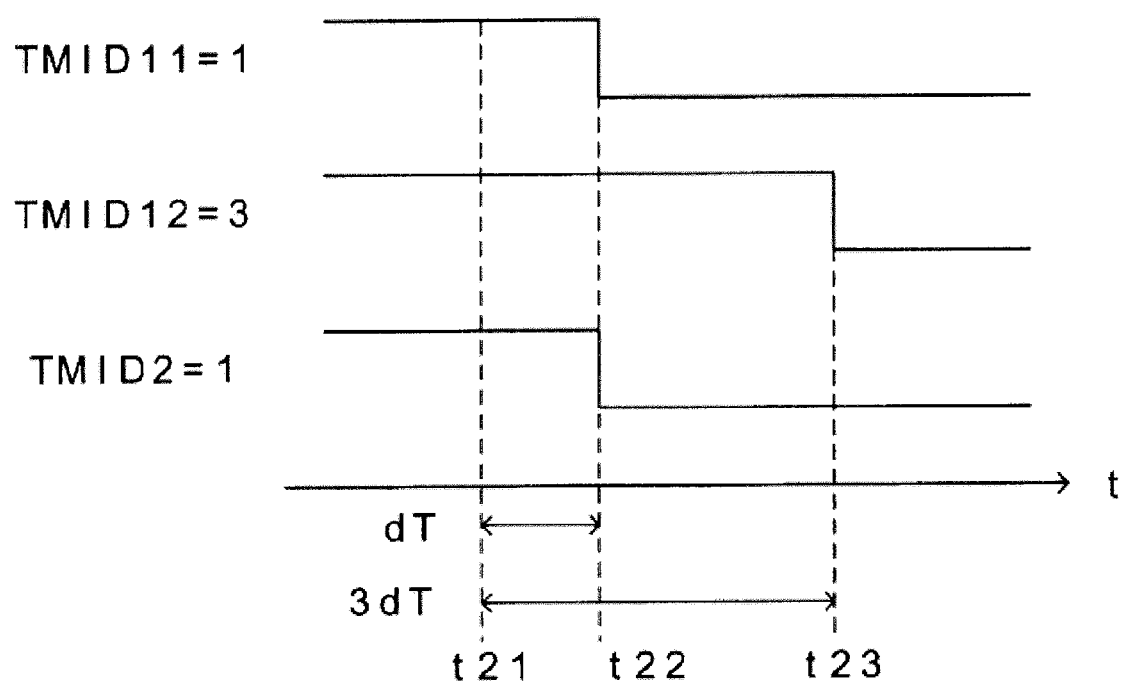
FIG. 9 is a voltage waveform diagram showing the operation of the transmission system of FIG. 8.

FIG. 9 is a voltage waveform diagram showing the operation of transmission system 100b of FIG. 8. The horizontal axis of FIG. 9 is time, and the vertical axis is time signal TMID11, TMID12, and TMID2, in that order. FIG. 9 shows an example in which TMID11=1 and TMID12=3. Time signal TMID11 transitions from high to low at time t22 only after dT from reference time t21 has passed, and time signal TMID12 transitions from high to low at time t23 only after 3dT from reference time t21 has passed. Hence, as shown in the figure, time signal TMID2 is generated to be equal to time signal TMID11 that transitions from high to low earlier than time signal TMID12. This means that time signal TMID2 is the minimum value of time signals TMID11 and TMID12.

Assuming 8-bit digital signals DIN1, DIN2 represented by thermometer code are not converted to time signals, in order to detect the minimum value, 8 AND circuits would be needed. By contrast, by converting digital signals DIN1 and DIN2 using DTC 111 and DTC 112 to time signals TMID11 and TMID12, respectively, the minimum value can be detected via one AND circuit.

FIG. 8 shows an example using 2-input AND circuits, but other appropriate logic circuits may be used. For example, the minimum value of 3 or more time signals may be detected using an AND circuit with 3 or more input terminals. In addition, the maximum value may be detected using OR circuits instead of AND circuits.

Furthermore, the present embodiment shows an example in which the time signal transitions from high to low, but the time signal may also be a signal that transitions from low to high. In such a case, the minimum value could be detected using an OR circuit, or the maximum value could be detected using an AND circuit.

In addition, at least one time signal is generated from a DTC; the other time signals do not necessarily have to be generated by a DTC.

Embodiment 4

The fourth embodiment shows an example in which circuit 2 is an adder that includes a separate DTC.

Figure 10:
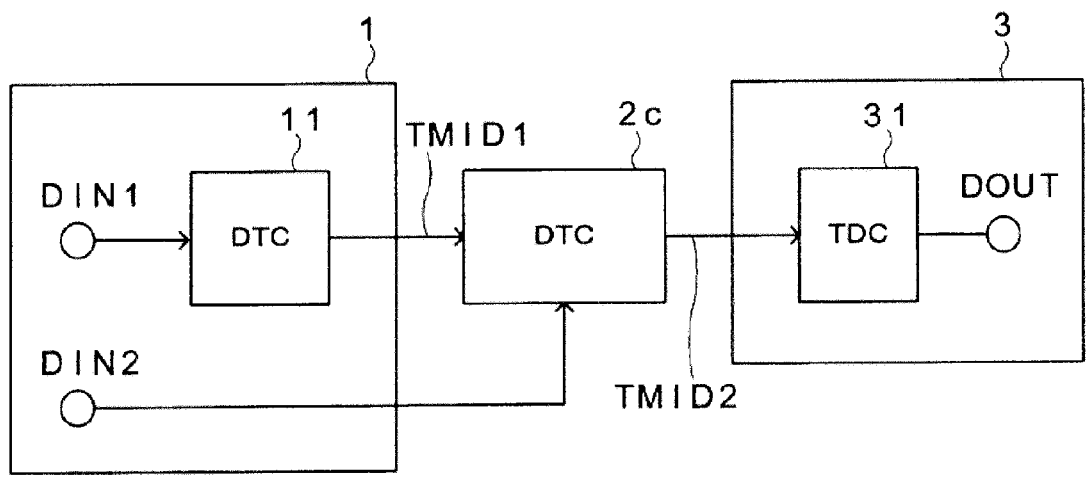
FIG. 10 is a schematic block diagram of a transmission system according to a fourth embodiment.

FIG. 10 is a schematic block diagram of transmission system 100c in accordance with the fourth embodiment. In FIG. 10, the same numerals are used to identify components that are the same in FIG. 1, and the description of the points of difference will be the focus below. In transmission system 100c of FIG. 10, circuit 2 of FIG. 1 is replaced with a delay circuit using DTC 2c, and the configuration of DTC 2c is similar to the configuration shown in FIG. 3, in one example. Also, time signal TMID1 is input into DTC 2c, not reference signal REF as in FIG. 3. The voltage level of each signal line of digital signal DIN2 is input as a delay control signal, and time signal TMID2 is generated. As will be described later, time signal TMID2 is the sum of digital signals DIN1, DIN2.

Figure 11:
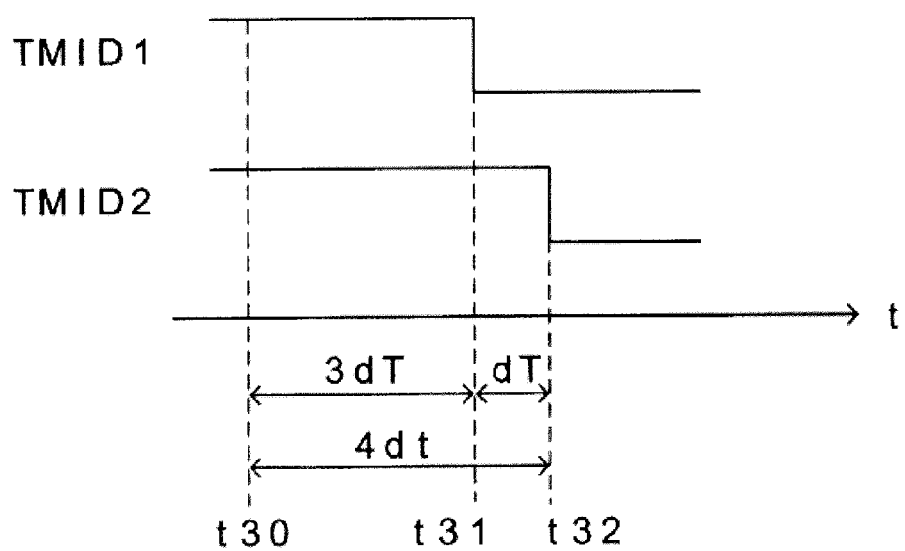
FIG. 11 is a voltage waveform diagram showing the operation of the transmission system of FIG. 10.

FIG. 11 is a voltage waveform diagram showing the operation of transmission system 100c of FIG. 10. The horizontal axis is time, and the vertical axis is time signal TMID1 and TMID2, in that order. The figure shows an example in which DIN1=3 and DIN2=1.

As shown, because DIN1=3, time signal TMID1 transitions from high to low at time t31 after 3dT has passed from reference time t30. On the other hand, because DIN2=1, in DTC 2c, time signal TMID2 is generated by delaying time signal TMID1 by dT. Namely, time signal TMID2, which transitions from high to low at time t32 after 4dT has passed from reference time t30, is generated in DTC 2c. The time difference 4dT between reference time t30 and time t32t is the sum of digital signals DIN1, DIN2.

Furthermore, when calculating the sum of three or more digital signals, DTC 2c may be cascade-connected.

In this way, in the fourth embodiment, in order to convert one of the digital signals to a time signal, it can simply be added by a circuit.

Embodiment 5

The fifth embodiment shows an example for carrying out multiplication by a constant. More concretely, digital signal DOUT is digital signal DIN multiplied by coefficient m.

Figure 12:
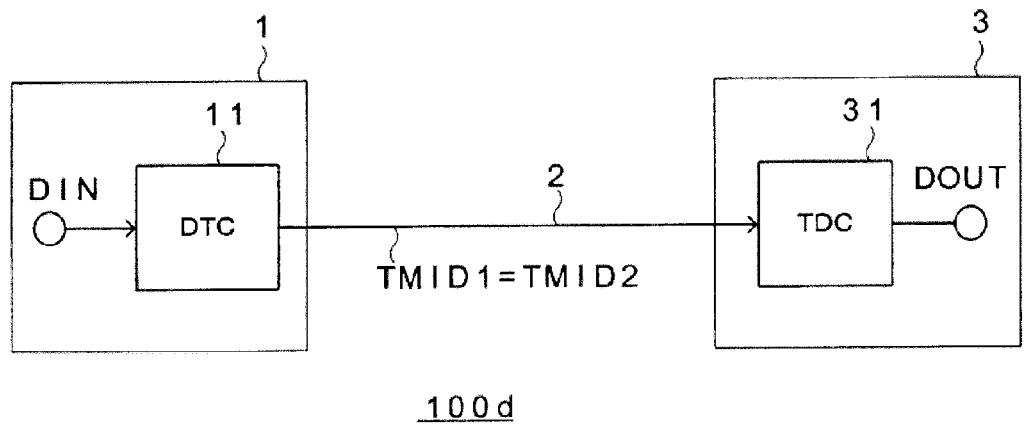
FIG. 12 is a schematic block diagram of a transmission system according to a fifth embodiment.

FIG. 12 is a schematic block diagram of transmission system 100d in accordance with the fifth embodiment. In FIG. 12, the same numerals are used to identify components that are the same in FIG. 1, and the description of the points of difference will be the focus below. Circuit 2 in FIG. 12 is a transmission path that transmits time signal TMID1 as time signal TMID2 from transmitting portion 1 to receiving portion 3.

In each embodiment described above, the unit delay time of delay element 12a (FIG. 2) in unit delay circuit 12 in DTC 11 is equal to the unit delay time of delay elements 321-324 (FIG. 5) in TDC 31. By contrast, the two unit delay times in the present embodiment are different, and their ratio is set according to a coefficient m. Namely, if the unit delay time (proportionality factor) of DTC 11 is T1, the unit delay time (proportionality factor) of TDC 31 is set to T2=T1/m. Unit delay times T1, T2 can be adjusted according to the number and size of inverters that constitute delay element 12a in FIG. 2 and delay elements 321-324 in FIG. 5, for example.

Figure 13:
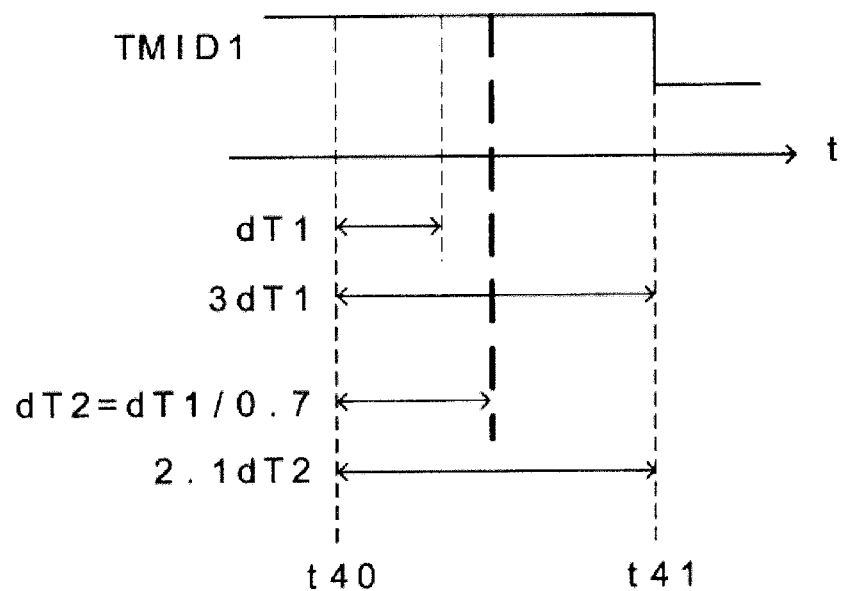
FIG. 13 is a voltage waveform diagram showing the operation of the transmission system of FIG. 12.

FIG. 13 is a voltage waveform diagram showing the operation of transmission system 100d of FIG. 12. The horizontal axis is time, and the vertical axis is time signal TMID1. FIG. 13 shows an example in which DIN=3, m=0.7, DOUT=m*DIN=2.

Because DIN=3, time signal TMID1 transitions from high to low at time t41 after 3dT1 has passed from reference time t40. That is, because dT2=dT1/0.7, time t41 is the time after 2.1*dT2 has passed from reference time t40. Consequently, according to this delay time, TDC 31 in receiving portion 3 generates digital signal DOUT with a value of 2.

More generally, when DIN=a, DTC 11 generates time signal TMID1, which transitions from high to low at a time only after a*dT1=a*m*dT2 has passed from the reference time. Consequently, digital signal DOUT with a value of a*m is obtained via TDC 31.

In this way, with the fifth embodiment, the operation of multiplication by a constant can easily be carried out according to the ratio of the unit delay time of DTC 11 and the unit delay time of TDC 31.

Embodiment 6

The sixth embodiment is an example variation of the fifth embodiment in which digital signal DOUT, for which the sign of digital signal DIN is changed, is obtained.

The schematic configuration of the sixth embodiment is similar to FIG. 12 of the fifth embodiment. However, in the sixth embodiment, the clock signal CLK is input in delay element 321 in TDC 31 shown in FIG. 5, and time signal TMID2 (=TMID1) is input in the clock input terminal of each D flip-flop 33k. Namely, the configuration of clock signal CLK and time signal TMID2 are switched from the configuration of FIG. 12.

Figure 14A:
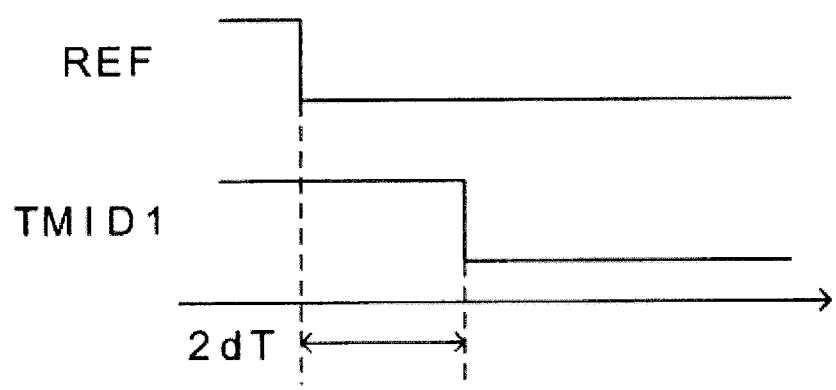
FIGS. 14A and 14B are voltage waveform diagrams showing the operation of a transmission system according to a sixth embodiment.
Figure 14B:
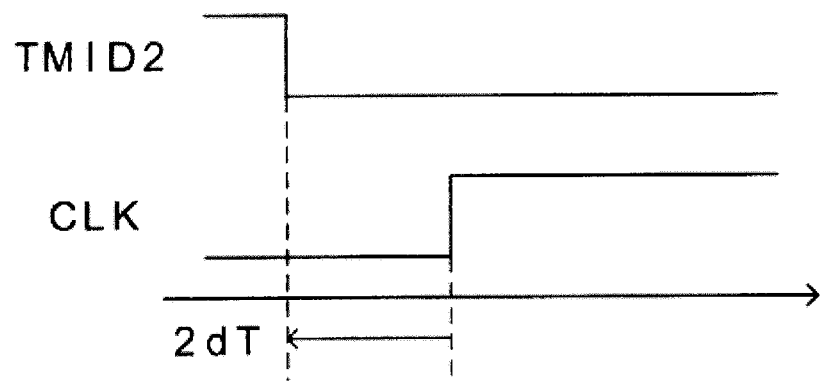

FIGS. 14A and 14B are voltage waveform diagrams showing the operation of the transmission system in accordance with the sixth embodiment, and an example where digital signal DIN=2 and digital signal DOUT=-2 is shown.

FIG. 14A shows the operation of DTC 11 in FIG. 12. DTC 11 converts digital signal DIN to time signal TMID 1, which is only delayed by 2dT relative to reference signal REF for reference time t50. This operation is the same as the other embodiments.

FIG. 14B shows the operation of TDC 31 in FIG. 12. Time signal TMID2 transitions from high to low, and clock signal CLK transitions from low to high at a time after time 2dT has passed. However, as described above, since the configuration of clock signal CLK and time signal TMID2 is switched, −2 is shown as the resulting digital signal DOUT.

In this way, in the sixth embodiment, since clock signal CLK and time signal TMID2 for TDC31 are switched, the sign of digital signal DIN is simply reversed.

Furthermore, in the fifth embodiment, the sign of the proportionality constant of DTC 11 and the sign of the proportionality factor of TDC 31 can be considered to be different. Hence, by setting the absolute value of the two proportionality constants to different values, the operation of multiplying by a constant, including the sign, can be carried out.

The first through the sixth embodiments described above may be appropriately combined. For example, in addition to a transmission path, circuit 2 may include one or more of switch 2a, a logic circuit such as AND circuit 2b, and DTC 2c.

Figure 15A:
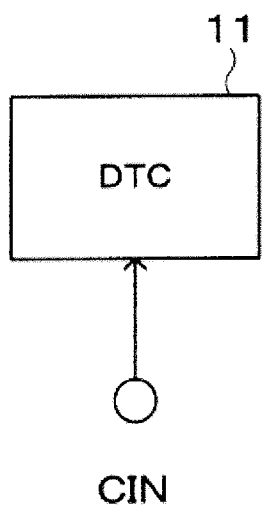
FIGS. 15A and 15B are schematic diagrams showing a variation in configuration of the DTC.
Figure 15B:
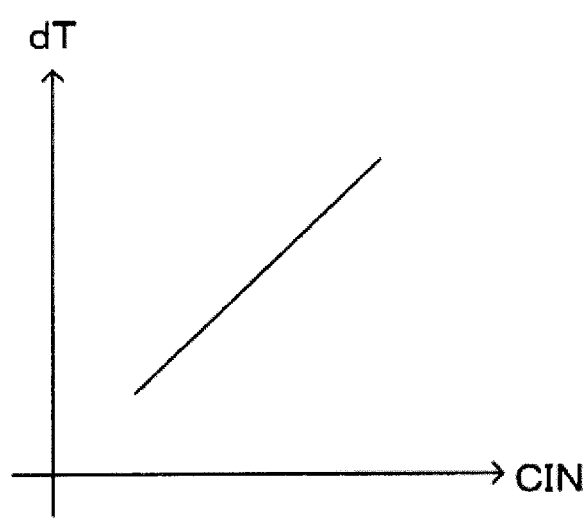
Figure 16A:
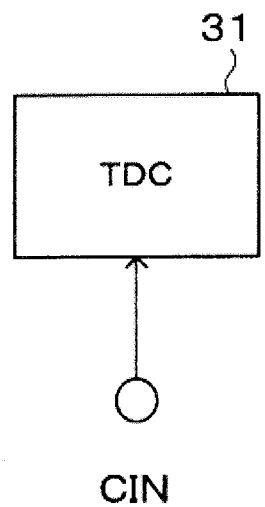
FIGS. 16A and 16B are schematic diagrams showing a variation in configuration of the TDC.
Figure 16B:
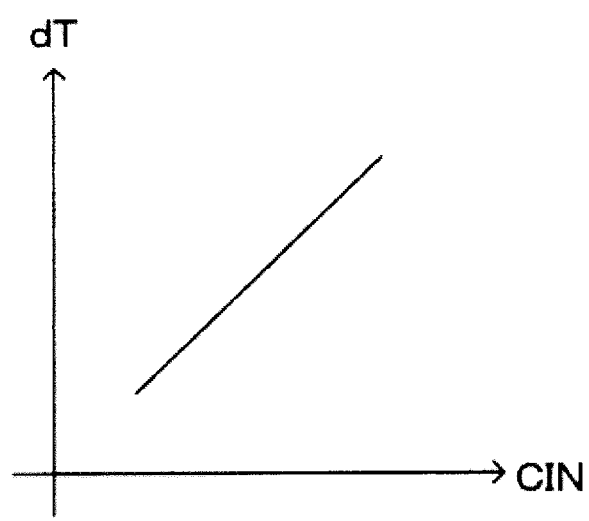

In addition, the descriptions above have assumed that the unit delay time (proportionality factor) dT of DTC 11 and TDC 31 is constant, but it may also vary according to the control signal. Namely, as shown in FIGS. 15A and 15B, control signal CIN is input in DTC 11 (FIG. 15A), and unit delay time dT may also be set proportionally to it, (FIG. 15B). Similarly, as shown in FIGS. 16A and 16B, control signal CIN is input in TDC (FIG. 16A), and unit delay time dT may also be set proportionally to it, (FIG. 16B).

Embodiment 7

A decoding device according to a seventh embodiment decodes coded data by a low-density parity-check (hereafter called "LDPC") code using DTC 11 and TDC 31. An LDCP code is a type of error correcting code. Because of their high level of error-correction capabilities, they are currently being used in a variety of broadband wireless communication standards and in storage devices such as NAND flash memory.

In the present embodiment, a MIN-SUM algorithm is used. In this algorithm, processing with equation (1) and (2) below is alternately applied.

$$\beta_{v_j \to c_i} = \lambda_j + \sum_{k \in B(j) \setminus i} \alpha_{c_k \to v_j} \tag{1}$$

$$\alpha_{c_k \to v_j} = \left\{ \prod_{k \in A(i) \setminus j} \text{sign}(\beta_{v_j \to c_i}) \right\} \left\{ \min_{k \in A(i) \setminus j} |\beta_{v_j \to c_i}| \right\} \quad (2)$$

Here, sign is a function that returns the sign, and min is a function that returns the minimum value.

Equation (1) above is called variable node processing. It adds probability information α from the check node and initial log likelihood ratio (LLR) λ based on the coded data and calculates probability information β.

Equation (2) above is called check node processing. It calculates probability information α based on probability information β from the variable node.

Figure 17:
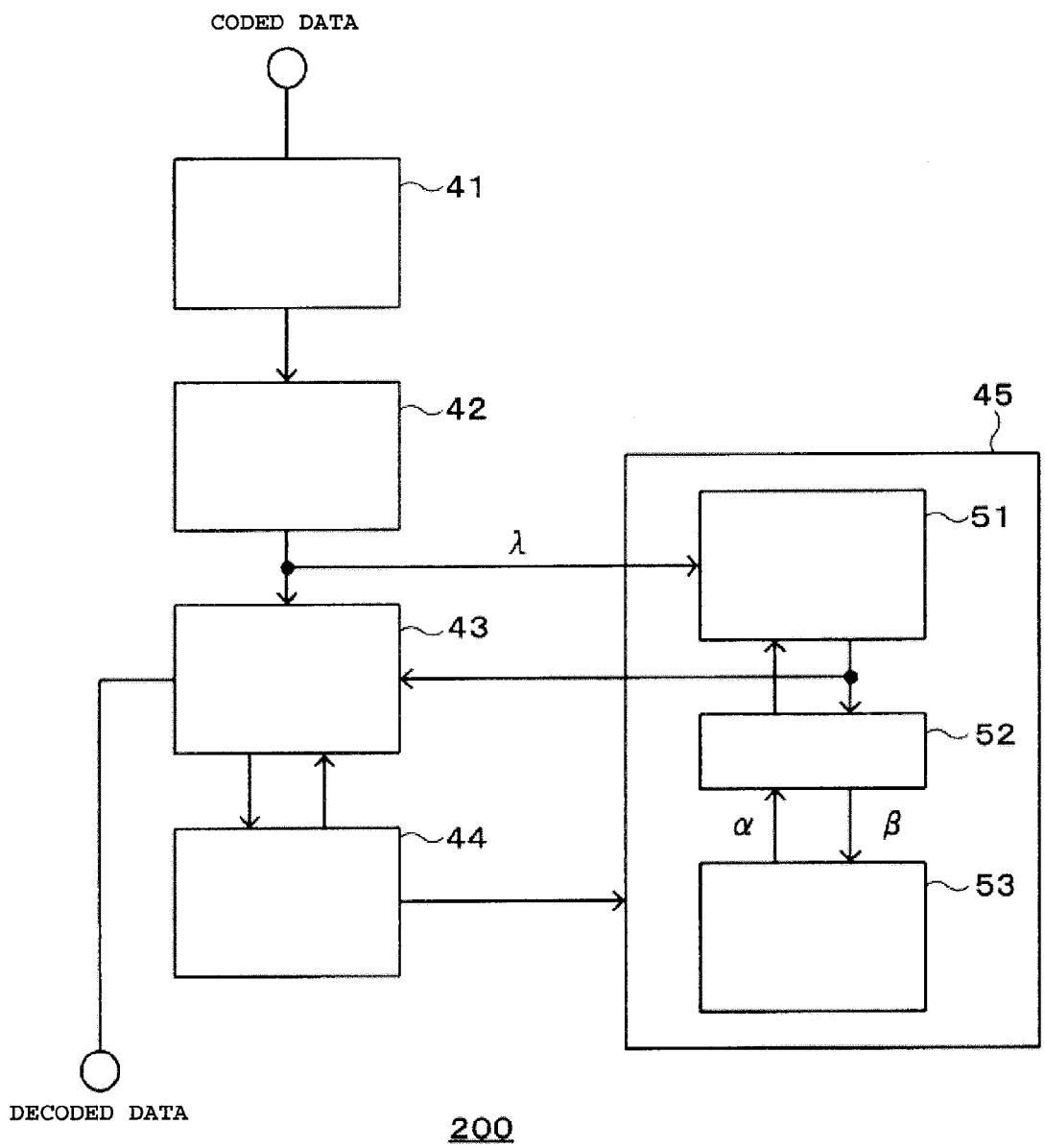
FIG. 17 is a schematic block diagram of a decoding device according to a seventh embodiment.

FIG. 17 is a schematic block diagram of decoding device 200 in accordance with the seventh embodiment. Decoding device 200 includes receiving portion 41, initial LLR calculating portion 42, hard decision portion 43, parity check portion 44, and operation portion 45.

Receiving portion 41 receives coded data according to the LDPC code. Initial LLR calculating portion 42 calculates initial LLR λ from the received coded data using an LLR table that is not illustrated.

Hard decision portion 43 decides whether the coded data is a "0" or a "1" based on initial LLR λ or probability information β to be discussed below. Parity check portion 44 performs a parity check on the data after the hard decision has been applied. If it passes the test, the results are transmitted to hard decision portion 43, and hard decision portion 43 outputs the data after the hard decision has been applied as decoded data. If it does not pass the test, a message to that effect is transmitted to operation portion 45, and the processing of equations (1) and (2) above is carried out again. Hard decision portion 43 and parity check portion 44 constitute the decoding portion that outputs the decoded data based on probability information β.

Operation portion 45 includes variable node operation portion 51, transmission path 52, and check node operation portion 53. The probability information is iteratively updated between variable node operation portion 51 and check node operation portion 53 via transmission path 52.

Variable node operation portion 51 calculates probability information β according to equation (1) above using probability information α that is transmitted from check node operation portion 53 and initial LLR λ. As can be seen from equation (1) above, variable node operation portion 51 carries out an addition operation.

Meanwhile, check node operation portion 53 calculates probability information α0 according to equation (2) above using probability information β that is transmitted from variable node operation portion 51. As can be seen from equation (2) above, check node operation portion 53 carries out an operation to detect the minimum value.

In general, about several thousand values of probability information α and β are transmitted between variable node operation portion 51 and check node operation portion 53 via transmission path 52. Therefore, the present embodiment attempts to reduce the amount of wiring by transmitting probability information α and β as time signals.

Figure 18:
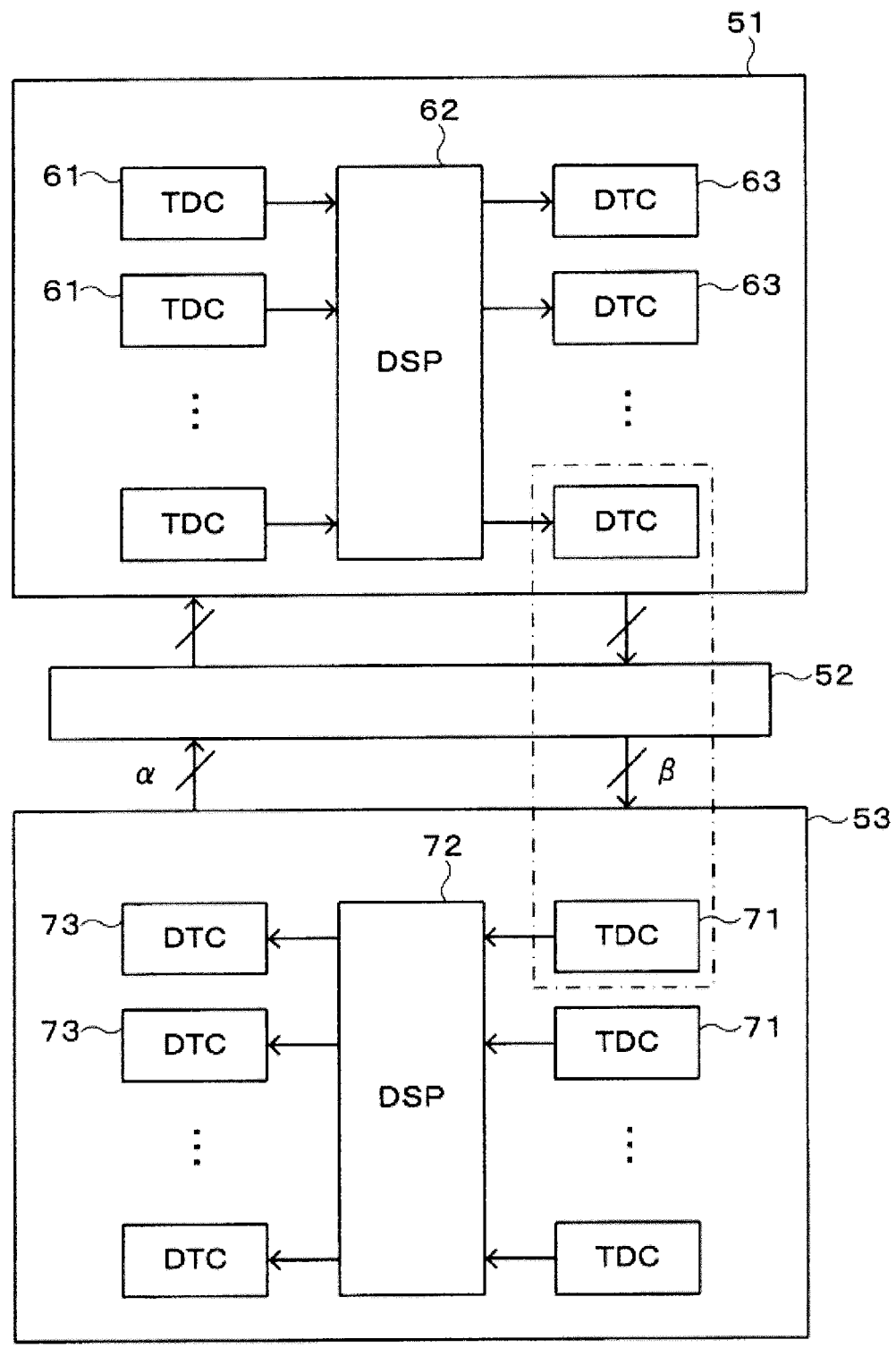
FIG. 18 is a block diagram showing an operation portion in the decoding device of FIG. 17 in more detail.

FIG. 18 is a block diagram showing operation portion 45 in more detail. Furthermore, the portion that is surrounded by a dashed-dotted line in FIG. 18 corresponds to FIG. 1.

Variable node operation portion 51 includes plural TDCs 61, digital signal operation portion (digital signal processor, hereafter called "DSP") 62, and plural DTCs 63.

For each TDC 61, the probability information α (the primary probability information) that is transmitted from check node operation portion 53 and that is represented by a time signal (the primary time signal) is converted to a digital signal (the primary digital signal). The internal configuration of TDC 61 is like what is shown in FIG. 5, for example, and the digital signal that is generated is represented by a thermometer code. DSP 62 and DTC 63 include addition circuits, and they generate probability information β (the secondary probability information) that is represented by a time signal (the secondary time signal) by carrying out the operation of equation (1) above. Furthermore, initial LLR λ is also input from one of the DTC 63s within variable node operation portion 51 and is converted to a time signal.

Figure 19:
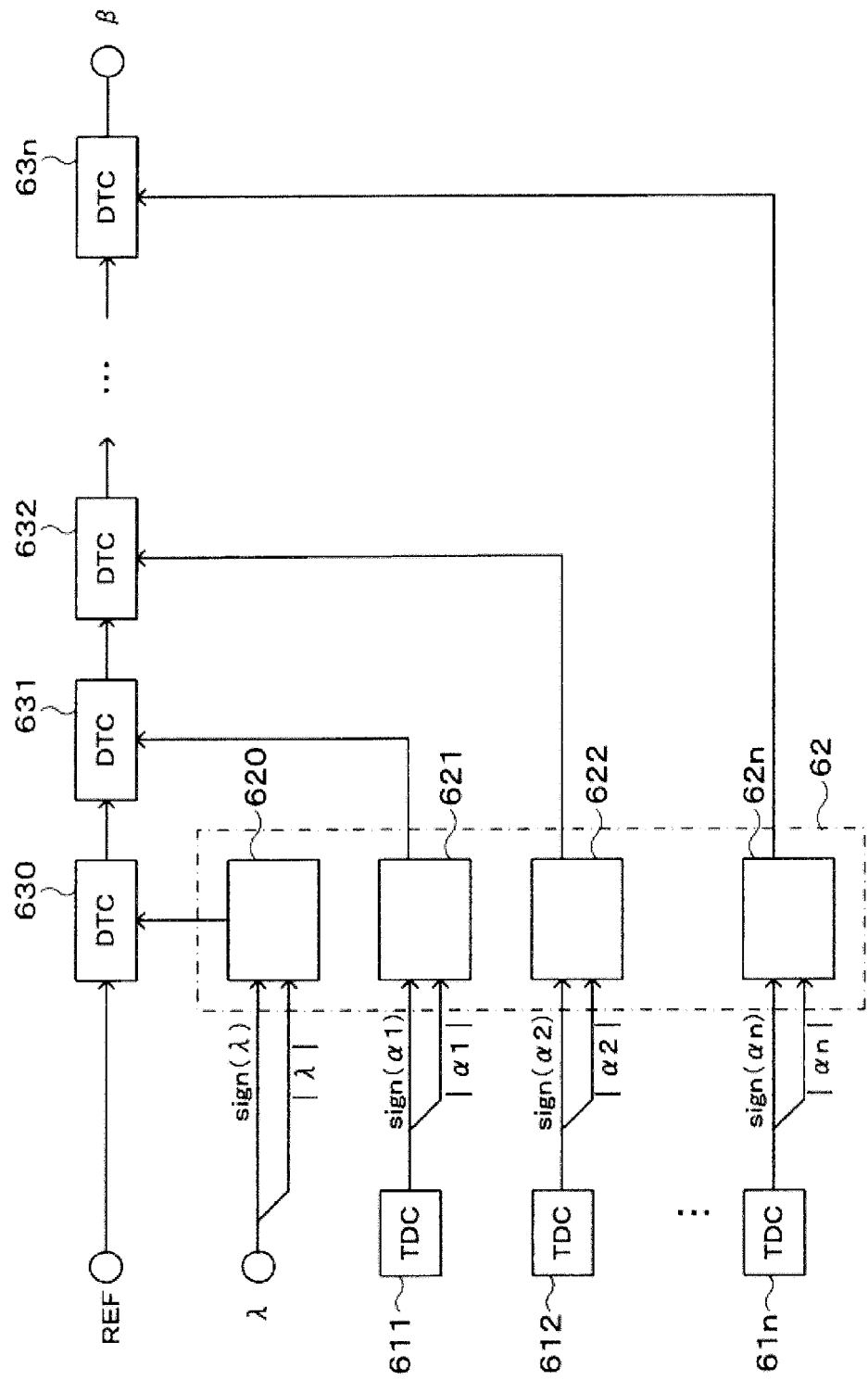
FIG. 19 is a diagram showing an example of a circuit for performing an addition operation in a variable node operation unit of the decoding device of FIG. 17.

FIG. 19 is a diagram showing an example of a circuit for performing an addition operation in variable node operation portion 51. The operation for adding the plural values of probability information α in equation (1) above can be carried out simultaneously to the digital-to-time conversion processing via DTC 63. Furthermore, in order to simplify the description, the second term of equation (1) above shall be the sum of n α terms (e.g., sum of α1 through αn). In addition, the plural TDC 61s and DTC 63s in FIG. 18 are written as TDC 611-61n and DTC 630-63n, respectively, in FIG. 19.

In the example of FIG. 19, the absolute value and the sign of probability information α1-αn are transmitted from check node operation portion 53 separately. Then, the absolute values (represented by |α1| and the like) of probability information α1-αn represented by time signals are each converted to probability information |α1|-|αn| represented by digital signals.

Furthermore, DSP 62 includes sign adjusting portions 620-62n. Sign adjusting portion 62k (k=1-n) generates Ofs+αk (where Ofs is the offset) in order to carry out an addition operation containing negative values. More concretely, in sign adjusting portion 62k, if the sign (αk) of probability information αk is positive, |αk|+Ofs is output, and if the sign (αk) of probability information αk is negative, −|αk|+Ofs is output. Here, the offset Ofs is taken as the absolute value or higher of the minimum value for which initial LLR λ and probability information α can be taken. In this way, probability information αk that is 0 or positive is input into DTC 63k. In addition, sign adjusting portion 620 in DSP 62 carries out the same processing on initial LLR λ.

The (n+1) DTCs 630-63n are cascade-connected in variable operation node portion 51. Each of these are a DTC 11 in which unit delay circuits are cascade connected as shown in FIG. 3, for example. Each bit including initial LLR λ and probability information α1-αn is input in each of the unit delay circuits as a delay control signal.

Reference signal REF that transitions from high to low at a reference time is input in the initial-stage DTC 630. For the final-stage DTC 630n, the value β' shown in equation (3) below is output based on the same principle as explained above in conjunction with FIG. 10.

$$\beta'_{v_j \to c_i} = \lambda_j + \sum_{k \in B(j) \setminus i} \alpha_{c_k \to v_j} + (n+1) * Ofs \quad (3)$$

This value β' is just the value of the offset (n+1)*Ofs in the third term for probability information β in equation (1) above, so by setting the reference time appropriately, the value β' can be transmitted to check node operation portion 53 as probability information β, which is a time signal, via transmission path 52.

FIG. 19 shows one example for carrying out the operation of equation (1) above. The probability information β may be calculated via other techniques.

Returning to FIG. 18, check node operation portion 53 includes plural TDC 71s, DSP 72, and plural DTC 73s. For each TDC 71, the probability information β (the secondary probability information) that is transmitted from variable node operation portion 51 and that is represented by a time signal (the secondary time signal) is converted to a digital signal (the secondary digital signal). The internal configuration of TDC 71 is like what is shown in FIG. 5, for example, and the digital signal that is generated is represented by a thermometer code. DSP 72 calculates probability information α (the primary probability information) that is represented by a digital signal by carrying out the operation of equation (2) above. Each DTC 73 converts probability information α that is represented by a digital signal to a time signal (the primary time signal).

Figure 20:
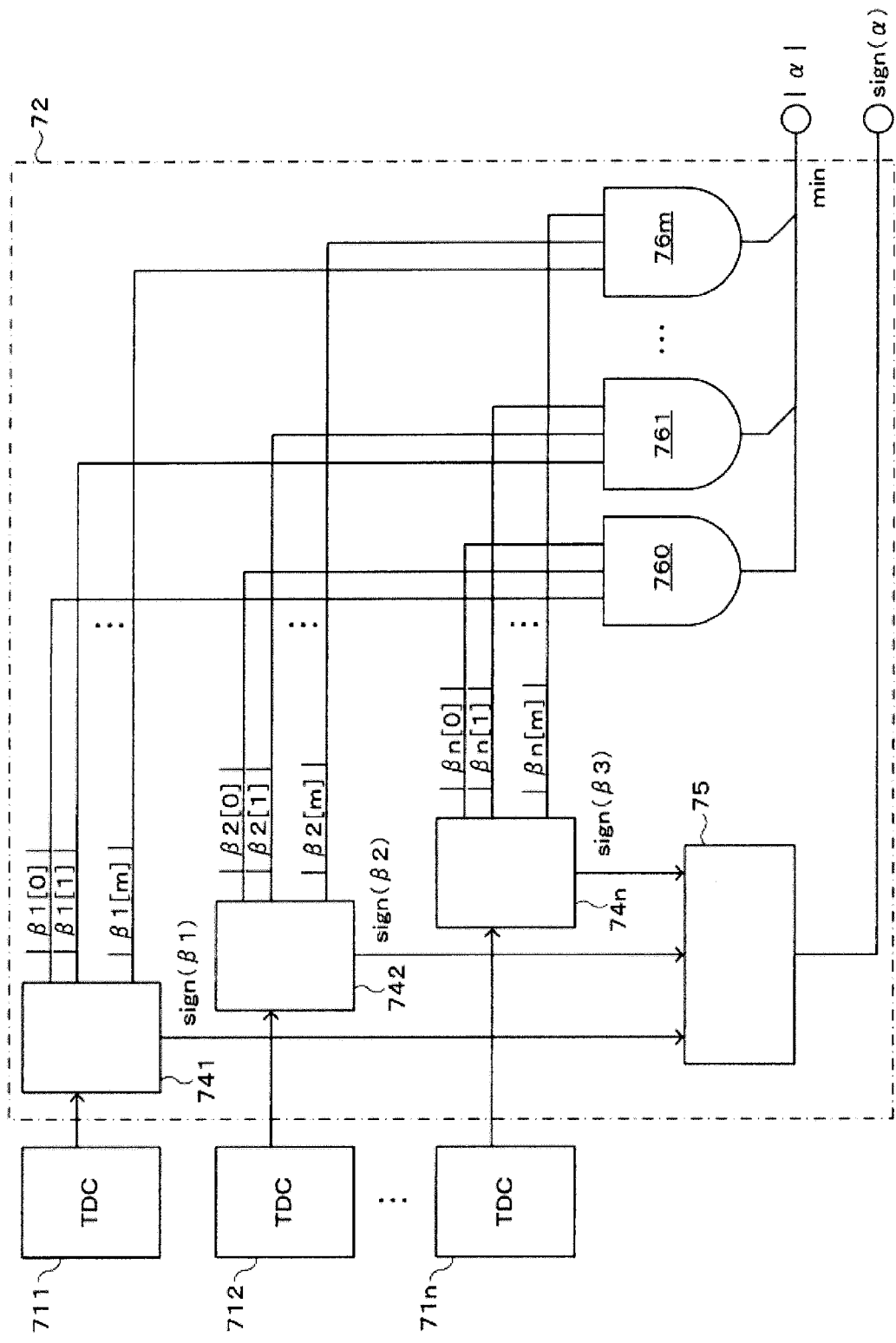
FIG. 20 is a diagram showing an example of a circuit for performing a minimum value detection operation in a check node operation unit of the decoding device of FIG. 17.

FIG. 20 is a diagram showing an example circuit for performing a minimum value detection operation in check node operation portion 53. The operation for detecting the minimum value in equation (2) above may calculate the logical product for each bit corresponding to the digital signal represented by a thermometer code. Furthermore, in order to simplify the description, the minimum value will be detected from the n values of probability information β, namely β1 through βn, in equation (2) above. In addition, the values of β1 through βn will all be (m+1) bits. Additionally, the plural TDC 71s in FIG. 18 are written as TDC 711-71n. TDC 71k converts probability information βk represented by a time signal to a digital signal represented by a thermometer code containing coded information.

DSP 72 includes n number of sign extracting portions 741-74n, sign calculating portion 75, and (m+1) number of AND circuits 760-76m. Sign extracting portion 74k separates probability information βk into both the sign (βk) and the absolute value |βk|. If probability information βk is generated via FIG. 19, if probability information βk is larger (smaller) than Ofs, the sign (βk) is positive (negative), and the difference between probability information βk and Ofs is the absolute value |βk|. Sign calculating portion 75 calculates the product of sign (β1) to sign (βk) and outputs a +1 or −1. This value is the value in the first set of { } in equation (2) above; in other words, it corresponds to the sign of probability information α.

AND circuit 76k calculates the k-th bit (written as β1[k]) logical product of the absolute value |β1|-|βn| of the probability information. Then, the minimum value min of |β1|-|βn| is detected by connecting the output of AND circuits 761-76m. In this way, AND circuits 760-76n constitute the minimum detection circuit for detecting the minimum value of |β1|-|βn| by carrying out a logical operation for each bit corresponding to the digital signal indicating probability information β. This minimum value min is the value in the second set of { } in equation (2) above; in other words, it corresponds to the absolute value of probability information α.

Then, the sign and absolute value of probability information α are separately transmitted to variable node operation portion 51 in FIG. 18.

In contrast to a circuit for detecting a minimum value from a digital signal represented as binary code, the minimum value can be detected by the small-scale circuit shown in FIG. 20 by representing probability information β as thermometer code.

FIG. 20 shows one example for carrying out the operation of equation (2) above. The probability information β may be calculated via other techniques. For example, if the absolute value and the sign of probability information β are transmitted from variable node operation portion 51 separately, sign extracting portions 741-74n may be omitted.

Figure 21:
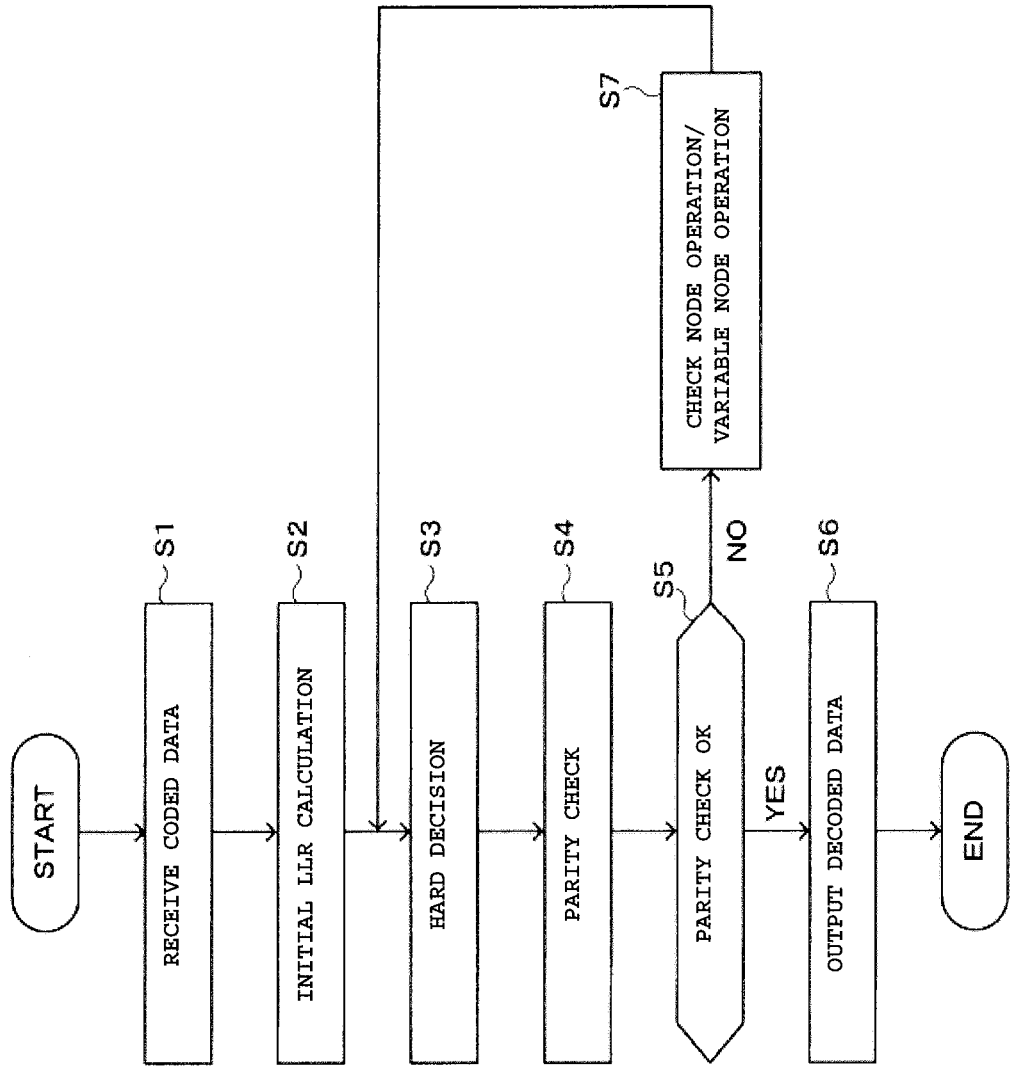
FIG. 21 is a flow chart showing an example of a handling operation of the decoding device of FIGS. 14A and 14B.

FIG. 21 is a flow chart showing an example of a handling operation of decoding device 200 of FIG. 17.

First, receiving portion 41 receives coded data (step S1). Next, initial LLR calculating portion 42 calculates initial LLR 2 from the coded data (step S2). Then, hard decision portion 43 carries out a hard decision based on initial LLR λ and generates a temporary estimate term to indicate whether the coded data is a "0" or a "1" (step S3). Parity check portion 44 carries out a parity check using the temporary estimate term (step S4). As a result of the parity check, if there is no error (a YES from step S5), hard decision portion 43 outputs the temporary estimate term as decoded data (step S6).

As a result of the parity check, if there is an error (a NO from step S5), a check node operation is carried out by check node operation portion 53 and a variable node operation is carried out by variable node operation portion 51 (step S7), and the values of probability information α and β are updated. Then, a hard decision is carried out based on the new probability information β and a temporary estimate term is generated (step S3).

The decoded data is output by carrying out the above processing until the parity check is passed.

In this way, the decoding device according to the seventh embodiment converts a digital signal showing probability information α and β to a time signal and carries out the addition operation and minimum value detection operation required by the MIN-SUM algorithm. Hence, these operations can be carried out by a circuit that is simpler than those in normal digital circuits. In addition, as can be seen from FIG. 19 and FIG. 20, passive elements such as resistance and capacitance are unnecessary for these circuits, and they can be configured using logic circuits that are used in digital circuits. Consequently, the circuit can be miniaturized.

In addition, probability information α and β are represented as time signals, which can represent plural values in one signal line, and the number of signal lines for transmissions between variable node operation portion 51 and check node operation portion 53 can be reduced.

Furthermore, as shown in FIG. 19, since initial LLR λ is a digital signal, it is not necessary to put in a new DA converter in order to input it into DTC 630 in variable node operation portion 51.

In addition, variable node operation portion 51 and check node operation portion 53 temporarily convert the time signal to a digital signal via a TDC. For that reason, memory is provided in operation portion 45 so that probability information α and β can be temporarily stored. This also makes it possible to further miniaturize the circuit of operation portion 45 by configuring it to carry out serial processing.

Decoding device 200 of FIG. 17 can also be implemented in a memory controller of a memory device, in one example.

Figure 22:
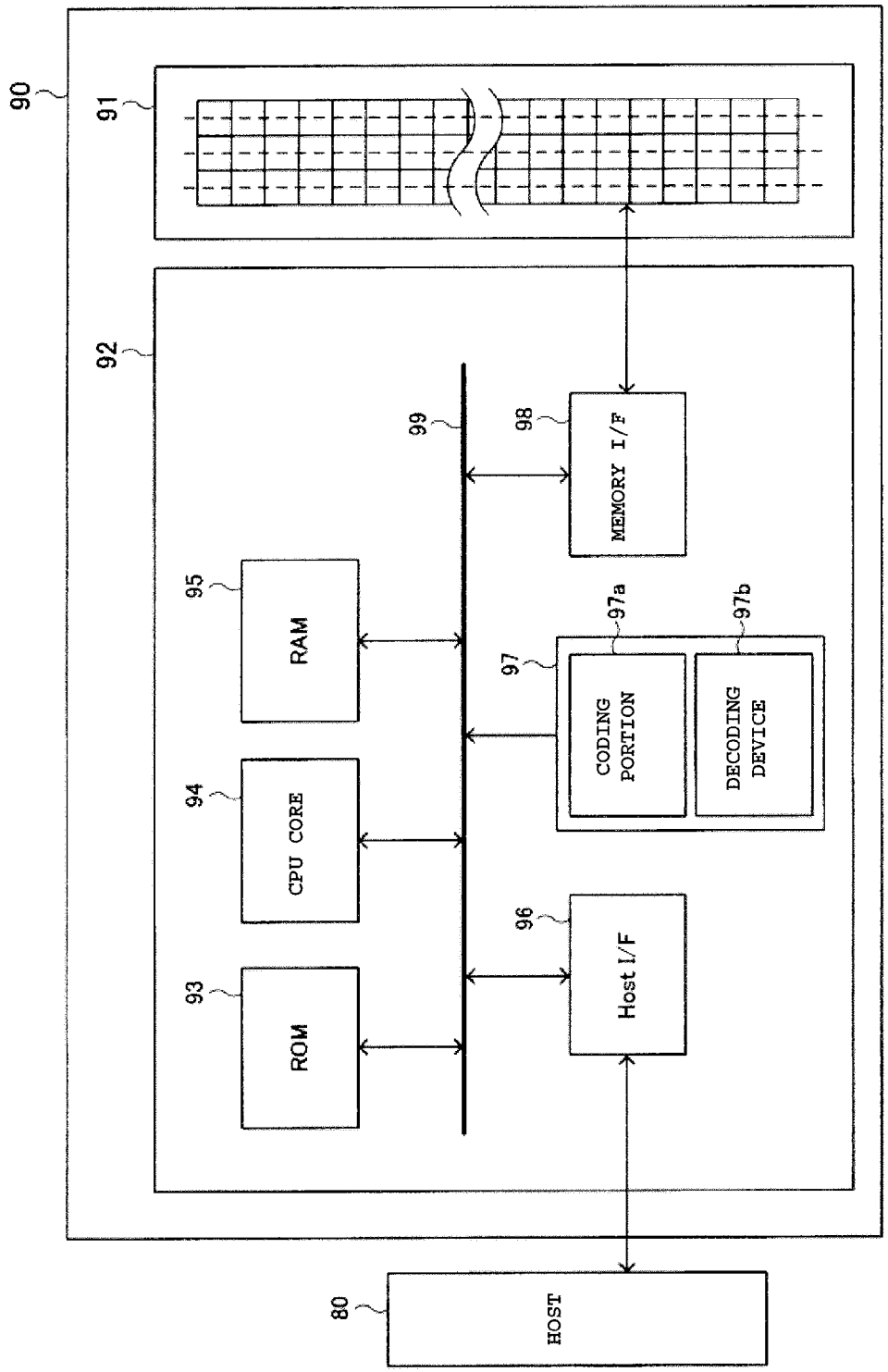
FIG. 22 is a schematic block diagram of a memory system containing the decoding device of FIGS. 14A and 14B.

FIG. 22 is a schematic block diagram of memory system 90 containing decoding device 200. This memory system 90 shows an example of a memory card that sends and receives data to and from host 80, such as a personal computer or a digital camera. Memory system 90 includes semiconductor storage device 91, like NAND flash memory, and memory controller 92 that controls it. Memory controller 92 includes ROM 93, CPU core 94, RAM 95, host interface (Host I/F) 96, error correcting portion 97, which includes coding device 97a and decoding device 97b, and memory interface (Memory I/F) 98. These are connected to each other via bus 99.

Memory controller 92 uses CPU core 94 and carries out the sending and receiving of data signals to and from host 80 via host interface 96. It also carries out the sending and receiving of data signals to and from semiconductor storage device 91 via memory interface 98. The control program or the like of memory system 90 is stored in ROM 93, and an address mapping table or the like needed in address administration is stored in RAM 95.

Coding device 97a within error correcting portion 97 generates and stores an error correcting code when the data is stored. In addition, during data readout, the coded data that is read is decoded by decoding device 97b. Error correcting portion 97 uses LDPC code, which is error correcting code for processing by decoding through iterative calculations based on probability. Decoding device 97b in this configuration can be treated as decoding device 200 in FIG. 17.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A decoding device for decoding received data that has been coded based on low-density parity-check code, comprising:
   a variable node operation unit for generating secondary probability information based on primary probability information and the received data; and
   a check node operation unit for generating the primary probability information based on the secondary probability information,
   wherein at least one of the primary probability information and the secondary probability information that are to be transmitted therebetween is represented by a time signal.

2. The decoding device according to claim 1, wherein
   the primary probability information is represented by a primary time signal, and encoded in a time difference between a reference time and a time when the primary time signal transitions between low and high levels, and
   the variable node operation unit converts the primary time signal to a primary digital signal and generates the secondary probability information based on the primary digital signal and the received data.

3. The decoding device according to claim 2, wherein
   the secondary probability information is represented by a secondary time signal, and encoded in a time difference between a reference time and a time when the secondary time signal transitions between low and high levels.

4. The decoding device according to claim 3, wherein the variable node operation unit includes:
   a plurality of primary time-to-digital converters, each for converting the primary time signal to the primary digital signal, and
   an addition circuit for generating the secondary time signal by adding the plurality of primary digital signals from the plurality of primary time-to-digital converters.

5. The decoding device according to claim 4, wherein the addition circuit includes:
   a plurality of cascade-connected unit delay circuits, each delaying a signal input thereto according to one of multiple bits that represented in the plurality of primary digital signals,
   wherein the signal input into the initial-stage unit delay circuit is a reference signal having a voltage level transition at a reference time, and a signal output from the final-stage unit delay circuit is the secondary time signal.

6. The decoding device according to claim 1, wherein
   the secondary probability information is represented by a secondary time signal, and is encoded as a time difference between a reference time and a time when the secondary time signal transitions between low and high voltage levels, and
   the check node operation unit converts the secondary time signal to the secondary digital signal and generates the primary probability information based on the secondary digital signal.

7. The decoding device according to claim 6, wherein
   the primary probability information is represented by a primary time signal, and is encoded as a time difference between a reference time and a time when the primary time signal transitions between low and high voltage levels.

8. The decoding device according to claim 7, wherein the check node operation unit includes:
   a plurality of secondary time-to-digital converters, each for converting the secondary time signal to the secondary digital signal;
   a minimum detection circuit for detecting the minimum value of an absolute value of the plurality of secondary digital signals by carrying out a logical operation for each bit corresponding to the plurality of second digital signals; and
   a digital-to-time converter for generating the primary time signal based on the minimum value,
   wherein the time difference between a reference time and the time when the voltage of the primary time signal transitions corresponds to the minimum value.

9. A memory controller comprising:
   a coding device for generating coded data by coding data based on low-density parity-check code;
   a memory interface for writing the coded data to a storage device as well as reading the coded data from the storage device; and
   a decoding device for decoding received data that has been coded based on the low-density parity-check code,
   wherein the decoding device includes a variable node operation unit for generating secondary probability information based on primary probability information and the received data, and a check node operation unit for generating the primary probability information based on the secondary probability information,
   wherein at least one of the primary probability information and the secondary probability information that are to be transmitted therebetween is represented by a time signal.

10. The memory controller according to claim 9, wherein
    the primary probability information is represented by a primary time signal, and encoded in a time difference between a reference time and a time when the primary time signal transitions between low and high levels, and
    the variable node operation unit converts the primary time signal to a primary digital signal and generates the secondary probability information based on the primary digital signal and the coded data.

11. The memory controller according to claim 10, wherein the variable node operation unit includes:
a plurality of primary time-to-digital converters, each for converting the primary time signal to the primary digital signal, and
an addition circuit for generating the secondary time signal by adding the plurality of primary digital signals from the plurality of primary time-to-digital converters, the addition circuit including a plurality of cascade-connected unit delay circuits, each delaying a signal input thereto according to one of multiple bits that represented in the plurality of primary digital signals,
wherein the signal input into the initial-stage unit delay circuit is a reference signal having a voltage level transition at a reference time, and a signal output from the final-stage unit delay circuit is the secondary time signal.

12. The memory controller claim 9, wherein
the secondary probability information is represented by a secondary time signal, and is encoded as a time difference between a reference time and a time when the secondary time signal transitions between low and high voltage levels, and
the check node operation unit converts the secondary time signal to the secondary digital signal and generates the primary probability information based on the secondary digital signal.

13. The memory controller according to claim 12, wherein the check node operation unit includes:
a plurality of secondary time-to-digital converters, each for converting the secondary time signal to the secondary digital signal;
a minimum detection circuit for detecting the minimum value of an absolute value of the plurality of secondary digital signals by carrying out a logical operation for each bit corresponding to the plurality of second digital signals; and
a digital-to-time converter for generating the primary time signal based on the minimum value,
wherein the time difference between a reference time and the time when the voltage of the primary time signal transitions corresponds to the minimum value.

14. A transmission system comprising:
a digital-to-time converter for converting a primary digital signal to a primary time signal;
a time-to-digital converter for converting a secondary time signal to a secondary digital signal; and
a circuit to which the primary time signal is transmitted from the digital-to-time converter and from which a secondary time signal that is based on the primary time signal is received at the time-to-digital converter,
wherein a time difference between a reference time and a time when the primary time signal transitions between low and high levels encodes data represented by the primary digital signal, and a time difference between a reference time and a time when the secondary time signal transitions between low and high levels encodes data represented by the secondary digital signal.

15. The transmission system according to claim 14, wherein
the circuit includes a switch, the primary time signal being transmitted through the circuit as the secondary time signal according to a position of the switch.

16. The transmission system according to claim 14, wherein
the circuit includes a logic circuit for carrying out a logical operation between the primary time signal and an auxiliary time signal to produce the secondary time signal.

17. The transmission system according to claim 16, wherein
the circuit is configured to add delays of the primary digital signal and the auxiliary digital signal to produce the secondary time signal.

18. The transmission system according to claim 14, wherein
the digital-to-time converter includes unit delay elements each introducing a first delay, and
the time-to-digital converter includes unit delay elements each introducing a second delay, and
the first and second delays different.

19. The transmission system according to claim 18, wherein
the signs of the first and second delays are different from each other.

20. The transmission system according to claim 19, wherein
at least one of the first and second delays is set according to a control signal.

* * * * *